United States Patent [19]
Rogers

[11] Patent Number: 6,091,794
[45] Date of Patent: Jul. 18, 2000

[54] FAST SYNCHRONOUS COUNTER

[75] Inventor: William C. Rogers, Dallas, Tex.

[73] Assignee: STMicroelectronics, Inc., Carrollton, Tex.

[21] Appl. No.: 08/977,957

[22] Filed: Nov. 25, 1997

[51] Int. Cl.[7] .................................................. H03K 21/16
[52] U.S. Cl. ......................... 377/116; 377/106; 377/107; 377/114; 327/142; 327/265
[58] Field of Search ..................................... 377/106, 107, 377/114, 116; 327/142, 265

[56] References Cited

U.S. PATENT DOCUMENTS 3,600,686  8/1971  Halsall ........................................ 377/48

*Primary Examiner*—Timothy P. Callahan
*Assistant Examiner*—Cassandra Cox
*Attorney, Agent, or Firm*—Stephen C. Bongini; Theodore E. Galanthay; Lisa K. Jorgenson

[57] ABSTRACT

A synchronous counter circuit having a plurality of bit counting stages, each corresponding to a bit position for representing counts, from a least significant bit to a most significant bit. Each bit counting stage includes a flip-flop circuit and a synchronization circuit and each includes circuitry for receiving a pulse train clock signal, synchronously counting said clock signal and outputting an output bit signal corresponding to said counters' stage bit position. The bit counting stages are arranged in two groups, a reset group and a counting group, such that the output bit signal of said flip-flop circuit of the reset group synchronizes data propagation between each bit counting stage of the counting group.

14 Claims, 6 Drawing Sheets ically in relation to the number of bits. This requisite increase in Boolean logic gates is usually schematically represented by two interchangeable and equivalent methods. The objective of both methods is the same: to accommodate additional requisite logic variables. Suppose we wish to add two logical input variables C and D to a logical expression A·B=O. The first method is to implement a Boolean logic gate that has two additional gate inputs to accommodate additional logical variables, for example, a two input AND gate's capacity is increased by implementing it with four inputs, such that A·B·C·D=O. The second method is to implement several Boolean logic gates connected as a group to accommodate additional requisite logical terms. Returning to the AND gate example, it is well understood that a four-input AND gate can be achieved by connecting each output of two-input AND gates into each input of a two-input AND gate. The result is a four-input AND gate constructed from three two-input AND gates. Expressed in Boolean logic notation (A·B)·(C·D)=O.

FAST SYNCHRONOUS COUNTER

FIELD OF THE INVENTION

The present invention relates to the field of digital electronic devices, and more specifically, to a synchronous counter circuit for serial communication protocols, pulse phase difference encoding circuits, time-to-digital conversion circuits, or synchronous counters employed in a clock-controlled PLL (phase lock loop), gate arrays.

BACKGROUND OF THE INVENTION

A variety of multiple bit counter circuits are realized by connecting flip-flop circuits with multi-input Boolean logic circuits. Counter circuits are often characterized by their numerical counting ability, usually expressed as the number of bits. When the number of bits in a counter circuit increases, this drives the requisite number of associated Boolean logic gates to also increase. Typically the number of Boolean logic gates increases exponent Typically as each additional bit is added to a counter circuit, the requisite additional Boolean logic increases as well. The Boolean logic is connected in distinct successive levels, e.g., one level of Boolean logic for two bits, another level of Boolean logic for four bits. A four bit counter circuit will typically have two or more levels of Boolean logic. The increase in the number of levels of Boolean logic levels necessary to accommodate an increased counter bit length, may not pose problems in theory, but practically it has several undesirable effects. The first undesirable effect is an increase in propagation time that reduces the maximum speed of operation. The second is that the increase in the levels of circuitry results in larger circuit sizes, more complicated interconnections, higher fabrication costs, and higher power consumption. Commercially available binary counters such as the SGS-Thomson family of binary counters 74HC160, 74HC393, 74HC590, 74HC4017, each requires multiple levels of logic to count and reset.

U.S. Pat. No. 5,361,289 issued Nov. 1,1994, to Kawano for "Synchronous Counter Circuit Having a Plurality of Cascade-Connected Counters" discloses a synchronous counter circuit comprising first and second counting circuits and a latch circuit. This counter has "ripple" combinatorial logic terms, which require multiple levels of logic for implementation.

U.S. Pat. No. 5,526,393 issued Jun. 11, 1996 to Knodo et al for "Synchronous Counter" discloses a synchronous counter circuit with a D flip-flop, and a J-K flip-flop, wherein each counter stage is connected by two or more levels of Boolean logic to count and reset.

Thus, a need exists for a high speed synchronous counter circuit realized with a minimum number of levels of Boolean logic.

SUMMARY OF THE INVENTION

Briefly in accordance with the invention, a synchronous counter circuit includes a plurality of bit-counting stages, each corresponding to a bit position, for representing counts from a least significant bit to a most significant bit. Each bit-counting stage includes a flip-flop circuit and a synchronization circuit having the ability to receive a pulse train clock signal, and to output an output bit signal corresponding to the counter stage is bit position wherein the bit counting stages are arranged in two groups, a reset group, and a counting group such that the output bit signal of the flip-flop circuit of the reset group synchronizes data propagation between each bit counting stage of the counting group.

BRIEF DESCRIPTION OF THE DRAWING(S)

DESCRIPTION OF A PREFERRED EMBODIMENT

Figure 1:
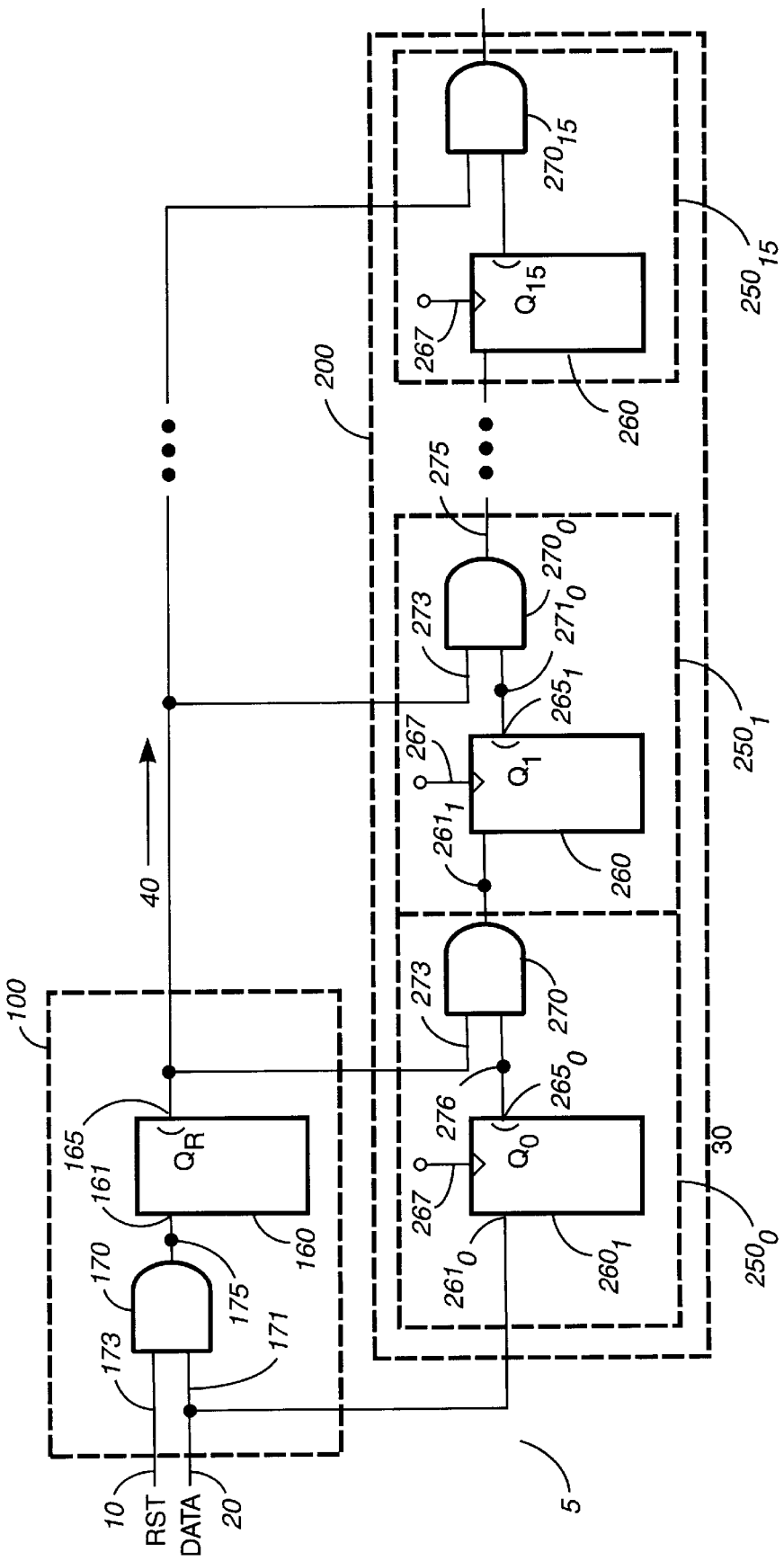
FIG. 1 is a circuit diagram illustrating a 16-bit counter according to one embodiment sent invention.

Referring to FIG. 1, depicted is a 16-bit fast synchronous counter circuit 5, according to the present invention. The synchronous counter circuit 5 is arranged in two distinct groups. One is a reset group 100, generating a synchronization signal 40 on output terminal 165. The other group is a counting group 200, comprising N count-signal units 250, each with an output terminal 265, for generating count signals on their output terminal 265 corresponding to the N bit count values. The total N-bit count value is generated by assembling the corresponding bit signal values from output terminal 265 of the N counting signal units 250 of counting group 200.

Reset group 100 contains an AND gate 170 and a D flip-flop 160. The AND gate 170 includes a reset terminal 173 for receiving a reset signal 10, a data terminal 171 for receiving data signals 20, and an output terminal 175 for outputting a signal corresponding to the resulting Boolean AND output. D flip-flop 160 includes a data input terminal 161 electrically connected to output terminal 175 of the AND gate 170, an input (not shown) for receiving a clock signal 30 and a data output terminal 165 for outputting a synchronization signal 40 corresponding to input data signal 20 synchronized by clock signal 30.

Each of the N-count signal units 250 of counting group 200, consists of a D flip-flip 260 and an AND gate 270. The D flip-flop 260 contains a data input terminal 261 for receiving a data input signal, a clock input terminal 267 for receiving a clock signal and a data output terminal 265 for outputting corresponding data output signals in a clocked response thereto. An AND gate 270 with input terminal 271 is electrically connected to the data output terminal 265 of a D flip-flip 260. The second input terminal 273 of AND gate 270 is connected to synchronization line 40 to synchronize the data output signal of data output terminal 265 with the output D flip-flop 160. The resulting configuration for counting group 200 consists of a cascade arrangement of N count signal units 250, each electrically connected to one another in successive bit order. This cascade configuration is depicted in FIG. 1.

Synchronous operation is achieved by having all D flip-flops of both the reset group 100 and N count signal units 250 of counting stage 200 clocked by clock signal 30 simultaneously. This permits all outputs to change coincidently with each other when so instructed by synchronization line 40 and AND gates 270.

Figure 2:
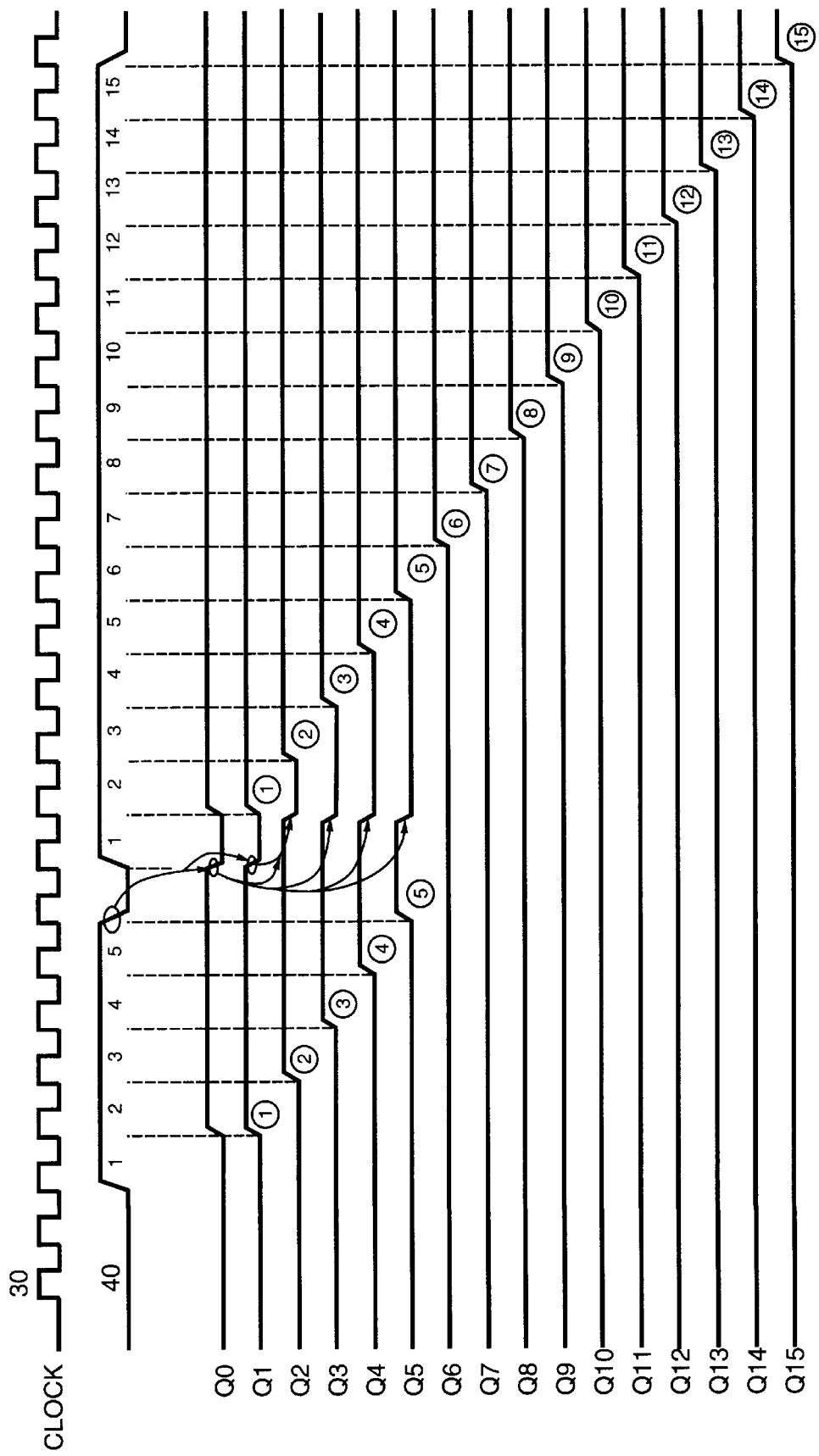
FIG. 2 is a timing diagram illustrating the operation of the counter in FIG. 1.

The AND gate 170 of reset group 100 provides two alternative methods for resetting synchronous counter circuit 5. The first method comprises: pulling the reset signal 10 to a low logic (zero) level. The second method comprises pulling the data signal 20 to the low logic level. Both of these methods reset all the count signal units 250 to zero during the next clock pulse asserted on line 30. FIG. 2 illustrates this second method of pulling the data signal 20 to a low logic level. After five clock counts, the counter stage output level counters $Q_0$, through $Q_5$ are all synchronously reset to zero on the next clock pulse and counter circuit 5 restarts the counting operation.

It is important to point out that although the number of bits (N) depicted in FIG. 1 is for a 16 bit counter, N can be customized for N-bit synchronous applications by cascading successive count signal units 250 without the need for additional gating.

Figure 3:
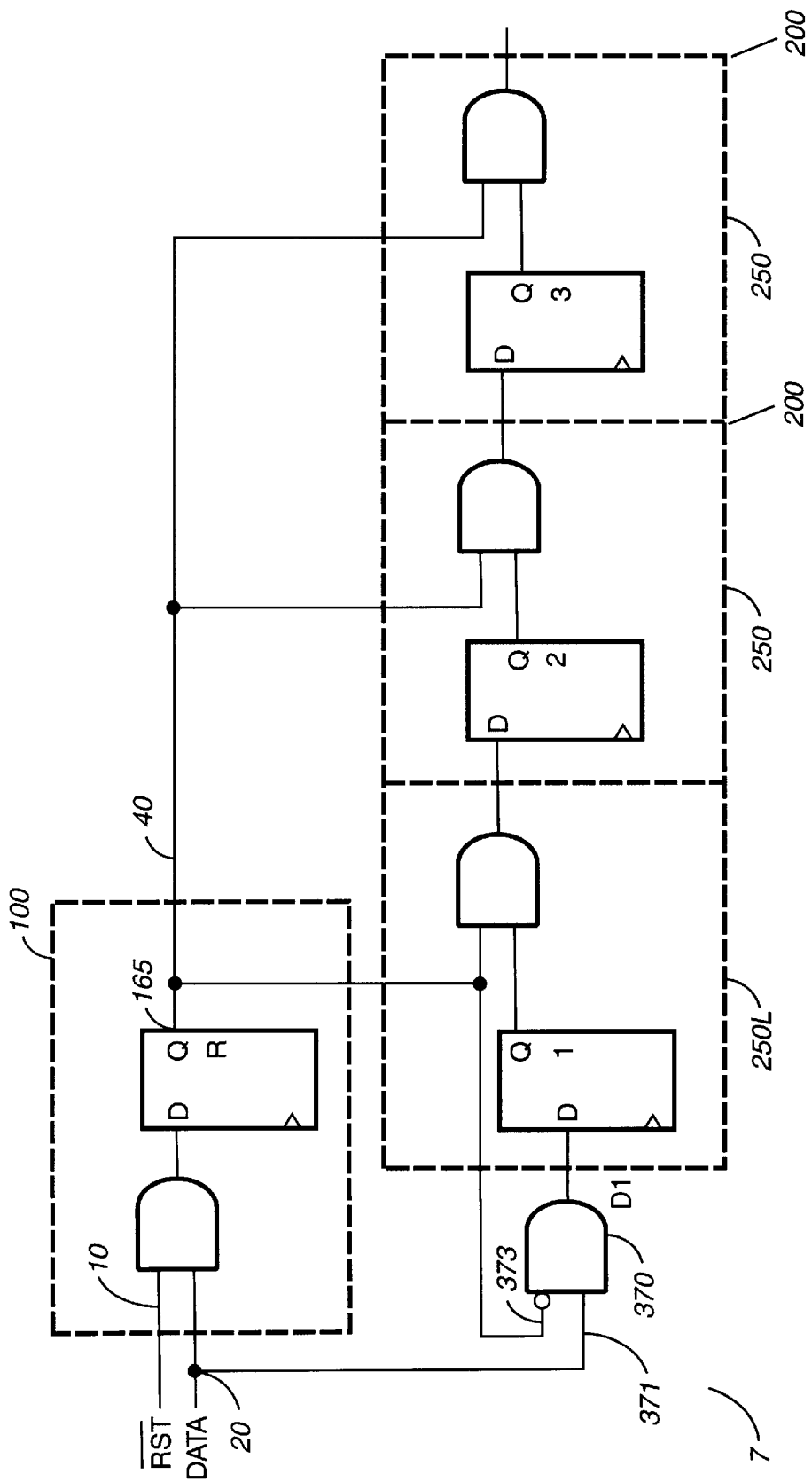
FIG. 3 is a circuit diagram illustrating another embodiment of the invention for producing pulsed counter outputs.
Figure 4:
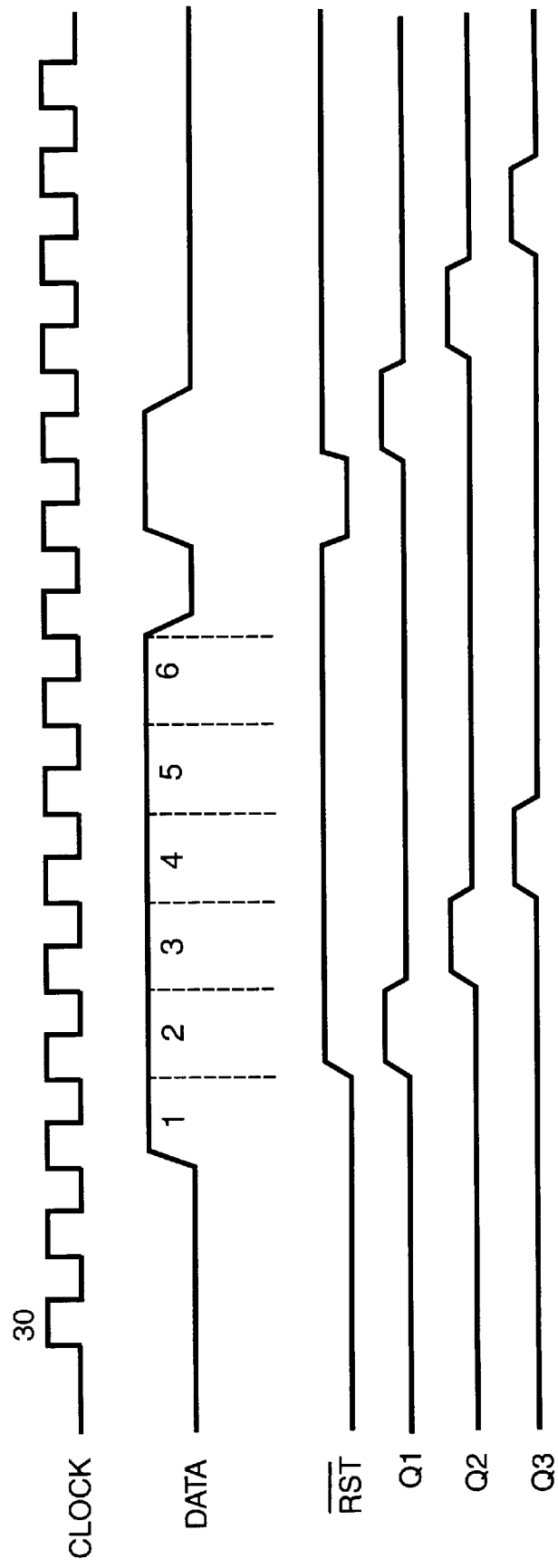
FIG. 4 is a timing diagram illustrating the operation of the counter in FIG. 3.

FIG. 3. is an alternative embodiment of the present invention for a three-bit (N=3) counter circuit 7. FIG. 4 illustrates the outputs of this counter circuit 7. The outputs of counter circuit 7 are pulse-width outputs as contrasted with the level outputs of counter circuit 5 in the first embodiment illustrated in FIG. 2. These pulse width outputs are regulated by the width of the synchronization clock signal 30. To achieve these pulse-width outputs, counter circuit 5 in FIG. 1. is modified in two ways. The first modification is the addition of an AND gate 370. The AND gate 370 is located prior to the first count signal unit 250L of counting group 200. AND gate 370 has two input terminals. The first input terminal 373 is an inverted input which is electrically connected and logically inverted from output terminal 165 of reset group 100 for receiving synchronization signal 40. The second input terminal is electrically connected to data signal 20. The second modification is that the outputs used to create the count are gathered at the output terminals of flip-flops $Q_R$ through $Q_N$, contrasted with the gathering of outputs from $Q_0$ through $Q_N$ of the previous embodiment. The output of $Q_R$ is equivalent to $Q_0$ for this configuration. But $Q_R$ is not meant to replace $Q_0$ for the other non-pulse width embodiments.

Figure 5:
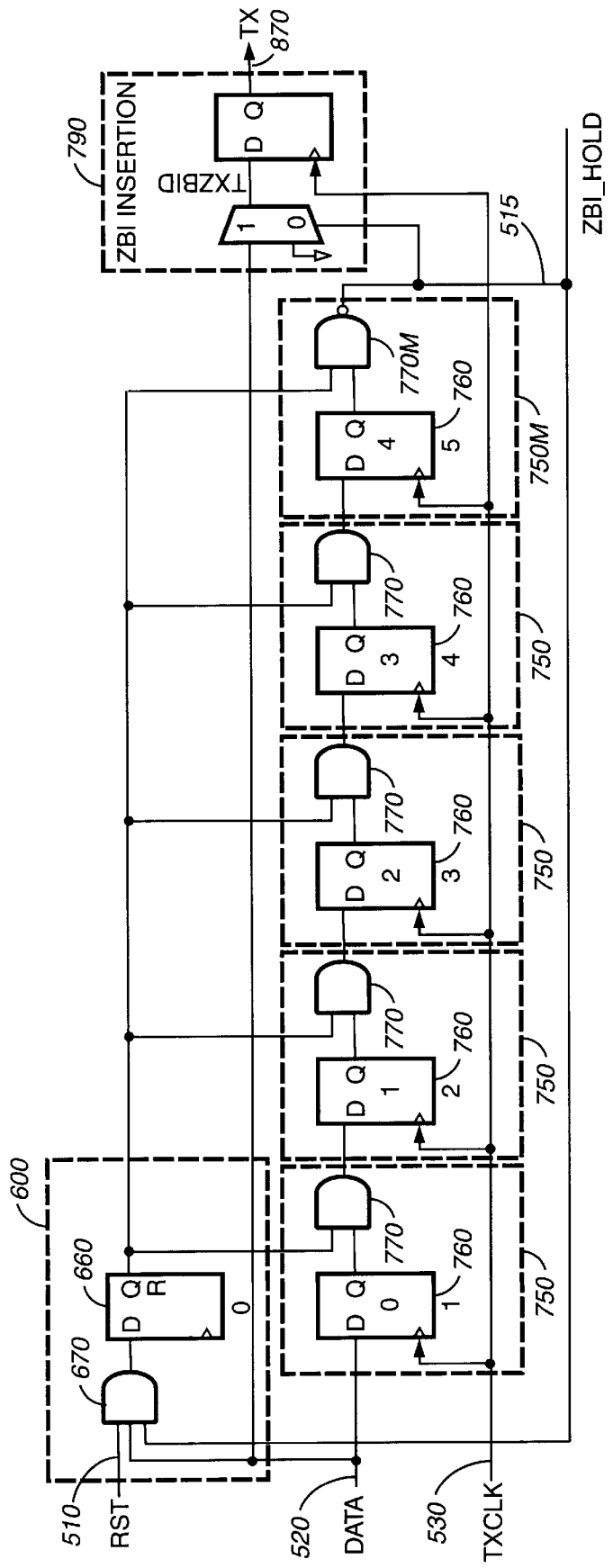
FIG. 5 is a circuit diagram illustrating another embodiment of the present invention with a zero insertion bit and a five logic one counter.
Figure 6:
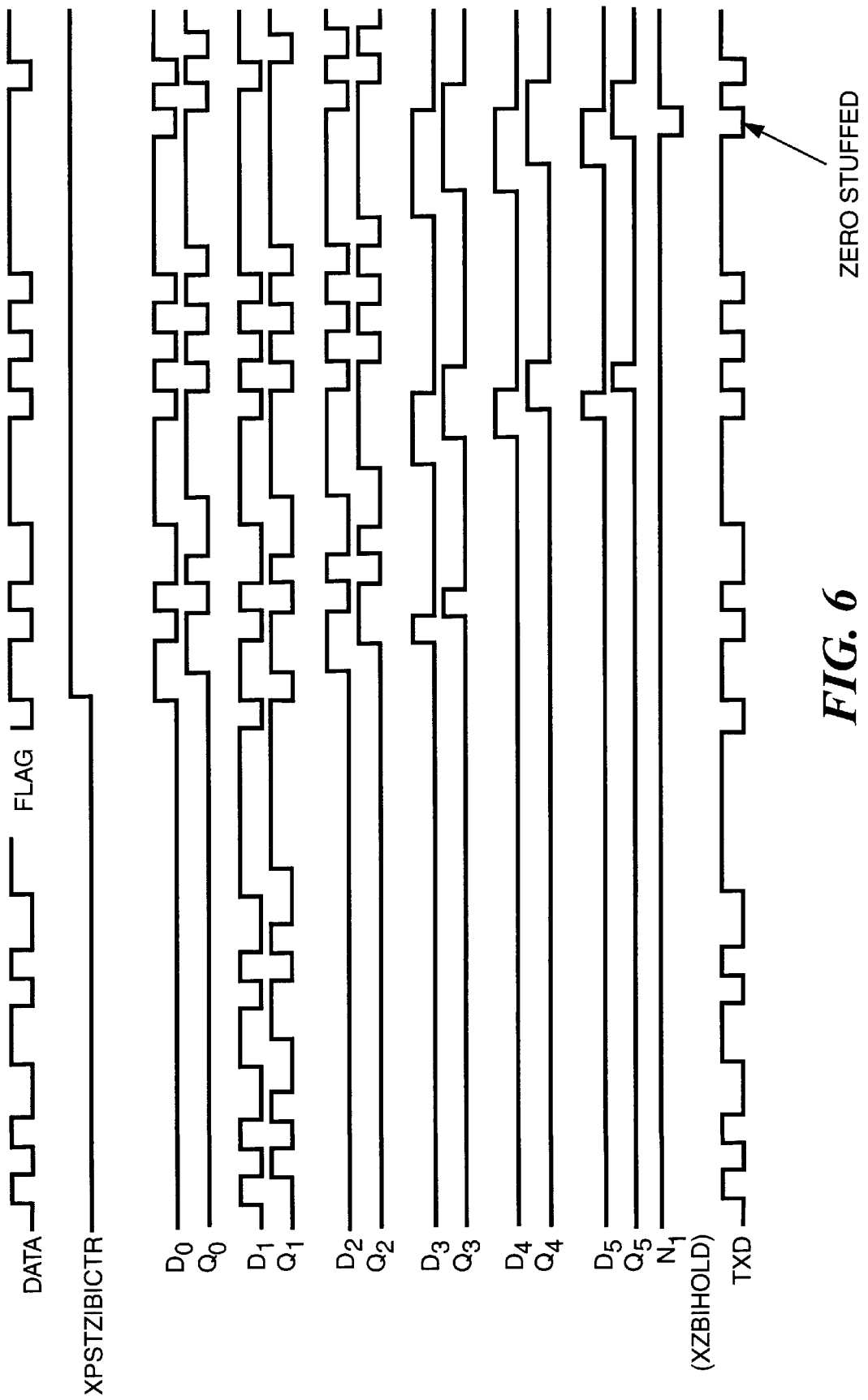
FIG. 6 is a timing diagram illustrating the operation of the counter in FIG. 5.

FIG. 5. is another embodiment of the present invention for a five-bit (N=5) counter circuit 500 shown for a five ones (logical level one) counter with a ZBI (Zero Bit Insertion) circuit 790. ZBI circuit 790 includes an output terminal 870 for outputting a serial stream of data corresponding to data input signal 520 but with a zero bit inserted after a sequence of 5 logical ones is received. In order to achieve the zero bit insertion after five sequential ones have been detected, the counting circuit in FIG. 1 is modified in three ways. First, the number of logic inputs on AND gate 670 (corresponding to gate 170) is increased from two to three. Second, the MSB (Most Significant Bit) counting signal unit 750M comprises a NAND gate 770M rather than the AND gate from the previous embodiment. Third, the output of NAND 770M gate produces ZBI-Hold command 515 which is a low signal (logical level zero) value when five sequential ones have been received on data line 520. The ZBI-Hold command 515 forces a zero bit to be outputted on output terminal 870 and the ZBI-Hold command is fed back to AND gate 670 of reset group 600 to force the reset group 600 to out put a zero no matter what the incoming data into the count sequence is.

While this invention has been illustrated and described in the preferred embodiments, many modifications and changes therein may be made by those skilled in the art. It is to be understood that this invention is not limited to the precise embodiment herein disclosed. Other embodiments contemplated in this invention include replacing the Boolean AND gate types to one of a DeMorgan equivalents comprising XOR, NOR, NAND, OR, etc. logic gates. The substitution of D flip-flops to J-K, D or T flip-flops. And, the use of a variety of base semiconductor technologies (e.g. Bi-Polar, CMOS, NMOS, PMOS, ECL, etc.) is contemplated to construct these gates. Accordingly, the right is reserved to all changes and modifications coming within the true spirit and scope of this invention.

I claim:

1. A synchronous counter circuit comprising:

a plurality of bit counting stages, each corresponding to a bit position for representing counts from a least significant bit to a most significant bit, and each connected to one another in successive bit order;

each bit counting stage comprising a flip-flop circuit and a synchronization gate; and a pulse control circuit comprising a reset circuit;

each said bit counting stage receiving a pulse train clock signal and a data signal, said bit counting stage synchronously counting said data signal corresponding to said pulse train clock signal, and outputting an output bit signal corresponding to said counter stage's bit position, the pulse train clock signal synchronizing data propagation through each synchronization gate of each bit counting stage of said higher order bit;

said pulse control circuit including means for producing a pulse control output bit signal representative of the logical product of a reset signal and said data signal; and said bit counting stages receiving said pulse control output signal of said pulse control circuit and producing output bit signals.

2. A synchronous counter circuit comprising:

a plurality of bit counting stages, each corresponding to a bit position for representing counts from a least significant bit to a most significant bit, and each connected to one another in successive bit order;

each bit counting stage comprising a flip-flop circuit and a synchronization gate;

each said bit counting stage receiving a pulse train clock signal and a data signal, said bit counting stage synchronously counting said data signal corresponding to said pulse train clock signal, and outputting an output bit signal corresponding to said counter stage's bit positions, the pulse train clock signal synchronizing data propagation through each synchronization gate of each bit counting stage of said higher order bit;

a zero bit insertion circuit with an enable terminal for receiving an enable signal; said zero bit insertion circuit including means for outputting a serial data output signal corresponding to said data input signal; said serial data output signal having a fixed logical value inserted therein in response to said enable signal; and said serial enable signal produced when said counting stage receives a predetermined quantity of constant data values corresponding to the number of counting group stages.

3. The synchronous counter circuit of claim 1 wherein said number of counting group stages is five.

4. The synchronous counter circuit of claim 2 wherein said constant data values are a logical value of one.

5. A data processing device comprising a synchronous counter circuit comprising:

a plurality of bit counting stages, comprising a first bit counting stage and one or more subsequent bit counting stages;

a reset circuit coupled to each of the bit counting stages to provide a synchronization signal for each bit counting stage, the reset circuit including a flip-flop for synchronizing the synchronization signal;

wherein the first bit counting stage consists essentially of:
 a flip-flop, with a clock input, a data input for receiving a data signal, and a data output; and
 a synchronization gate having a first input for receiving the synchronization signal, a second input coupled to the data output of the flip-flop, and an output for providing an output data signal to a subsequent bit counting stage corresponding to the next higher order bit;

and wherein each subsequent bit counting stage consists essentially of:
 a flip-flop, with clock input a data input for receiving the output data signal from a bit counting stage corresponding to a lower order bit, and a data output; and
 a synchronization gate having a first input for receiving the synchronization signal, a second input coupled to the data output of the flip-flop, and an output for providing the output data signal to a subsequent bit counting stage corresponding to the next higher order bit.

6. The synchronous counter of claim 1, wherein at least one of said flip-flops in at least one of said bit counting stages is a D flip-flop.

7. The synchronous counter of claim 1, wherein at least one of said flip-flops in at least one of said bit counting stages is a J-K flip-flop.

8. The synchronous counter of claim 1, wherein at least one of said flip-flops in at least one of said bit counting stages is a S-R flip-flop.

9. The synchronous counter of claim 1, wherein said synchronization gate is an AND gate.

10. The synchronous counter of claim 1, wherein said reset circuit further comprises:

a boolean gate with a first input coupled to receive the reset signal and a second input coupled to receive said data signal; and a flip-flop with an input coupled to an output of said boolean gate, and an output for producing a synchronization signal for synchronizing said output of each said bit counting stage.

11. The synchronous counter of claim 1, further comprising:

a zero bit insertion circuit for producing a serial stream comprising two parts:
 a first part corresponding to said data signal; and
 a second part corresponding to a low logical level, wherein said second part is produced after all said bit counting stages have received a data signal of a predetermined logical level for n counts of said pulse train clock signal where n corresponds to said number of bits in said counter.

12. The synchronous counter of claim 11, wherein said zero bit insertion circuit further comprises:

a flip-flop with a first input for receiving said data signal, a clock input for receiving said clock signal and an output for producing said serial stream.

13. The synchronous counter of claim 1, wherein each of said output bit signal is a logical level output.

14. The synchronous counter of claim 1, wherein each of said output bit signal is a pulse-width output.

* * * * *